United States Patent
Kim et al.

[11] Patent Number: 5,953,279
[45] Date of Patent: Sep. 14, 1999

[54] FUSE OPTION CIRCUIT FOR MEMORY DEVICE

[75] Inventors: Jung Pill Kim; Joon Ho Kim, both of Kyoungki-do, Rep. of Korea

[73] Assignee: Hyundai Electronics Industries Co., Ltd., Kyoungki-do, Rep. of Korea

[21] Appl. No.: 08/999,257

[22] Filed: Dec. 29, 1997

[30] Foreign Application Priority Data

Dec. 31, 1996 [KR] Rep. of Korea .................. 96-80243

[51] Int. Cl.$^6$ .................................................. G11C 7/00
[52] U.S. Cl. .................. 365/225.7; 365/200; 365/222
[58] Field of Search ........................... 365/225.7, 200, 365/222, 194, 96

[56] References Cited

U.S. PATENT DOCUMENTS

| | | |
|---|---|---|
| 5,323,353 | 6/1994 | Griffus et al. . |
| 5,619,469 | 4/1997 | Joo . |
| 5,812,466 | 9/1998 | Lee et al. .................. 365/225.7 X |
| 5,828,624 | 10/1998 | Baker et al. .................. 365/225.7 X |
| 5,841,709 | 11/1998 | McClure .................. 365/200 |

FOREIGN PATENT DOCUMENTS

| | | |
|---|---|---|
| 63-136714 | 6/1988 | Japan . |
| 5-89696 | 4/1993 | Japan . |
| 5-250892 | 9/1993 | Japan . |
| 6-20492 | 1/1994 | Japan . |

*Primary Examiner*—Huan Hoang
*Attorney, Agent, or Firm*—Thelen Reid & Priest LLP

[57] ABSTRACT

A fuse option circuit for memory device capable of performing the function of the fuse option circuit completely even in the case that the fuse is incompletely connected, is disclosed. The fuse option circuit according to the present invention includes a transistor serially connected to the fuse for alternatively selecting the turn-on resistance of the transistor being greater than the resistive components of the fuse when the fuse is stably connected, and smaller when the fuse is unstably disconnected, such that the advantageous effects which improve the production yield of the semiconductor device can be obtained by clearly determining the fuse connection state of the fuse option circuit.

6 Claims, 3 Drawing Sheets

FUSE OPTION CIRCUIT FOR MEMORY DEVICE

FIELD OF THE INVENTION

The present invention relates to a fuse option circuit used for memory device, more particularly to a fuse option circuit for memory device capable of performing the function of the fuse option circuit completely, even in the case that the fuse is incompletely connected.

BACKGROUND OF THE INVENTION

In general, a fuse option circuit for memory device is a control circuit that enables or disables a redundancy circuit in the memory device by controlling a connection state of fuse.

FIG. 1 is a conventional fuse option circuit.

As shown in the drawing, fuse 1 is connected between a power supply Vcc and a drain terminal A of the first NMOS transistor 11. The drain terminal A of the first NMOS transistor 11 is also connected to a common gate terminal of the first PMOS transistor 13 and the second NMOS transistor 12 which are connected in series. Here, the first PMOS transistor 13 and the second NMOS transistor 12 form a CMOS inverter. An output terminal B of the CMOS inverter is connected both to a gate terminal of the first NMOS transistor 11 which is connected to fuse 1, and to an input terminal of an inverter 14.

As fully appreciated from the above, according to the conventional fuse option circuit shown in FIG. 1, fuse 1 is connected between a power supply Vcc and a drain terminal A of the first NMOS transistor 11. On the contrary, FIG. 2 shows a state where the fuse 1 is disconnected.

The operation of the conventional fuse option circuit according to the prior art as discussed above will now be fully described in connection to FIGS. 1 and 2.

Referring now to FIG. 1 in which fuse 1 is connected, a high level potential at terminal A is produced through fuse 1 by means of the power supply Vcc. The high potential at terminal A effects the potential level at output terminal B of the CMOS inverter which has the first PMOS transistor 13 and a second NMOS transistor 12. The low level potential at output terminal B thus obtained is applied both to the gate of the first NMOS transistor 11 which is connected to fuse 1 in serial to keep the status of the first NMOS transistor 11 turning-off, and to the input terminal of inverter 14 so that the Vcc potential is outputted at the output terminal of inverter 14.

Referring to FIG. 2 in which fuse 1 is disconnected, even though terminal A is in a floating state, the junction leakage current is passed through the junction between terminal A and the substrate in fact. For this reason, the potential level at terminal A is kept to Vss potential which is ground potential. The Vss ground potential at terminal A is then outputted at the output terminal of the first inverter 14 through the CMOS inverter and the first inverter 14.

As such, the output potential of the fuse option circuit represents the Vcc potential which is a high level or the Vss potential which is a low level, in accordance with the connection state of the fuse. However, the fuse option circuit as mentioned above has a disadvantage which will be described in connection with FIG. 3, hereinafter.

FIG. 3 represents a state where the fuse 1 is incompletely cut and thus has a high resistance R. In FIG. 2 in which fuse 1 is completely connected, the potential level at terminal A is maintained as the Vss potential due to the junction leakage current, whereas in FIG. 3 shows that where fuse 1 is incompletely cut, the current is passed from the power supply Vcc through the fuse having a high resistance R and is then leaked through the junction between terminal A and the substrate. At the time, the output voltage of the fuse option circuit represents unstable potentials of the Vcc potential or the Vss potential, in accordance with the ratio of the high resistance R showing unstable values to the equivalent resistance at the junction connected to the substrate. That is, in the case that the value of the high resistance R is significantly greater than that of the equivalent resistance at the junction, the output of the fuse option circuit represents the Vss potential level as in the similar case of FIG. 2, so that the fuse option circuit operates stably. However, if the value of the high resistance R is significantly smaller than that of the equivalent resistance at the junction, the potential level at terminal A reaches a high level and the output of the fuse option circuit represents the Vcc potential level, which results in the failure of the operation of the fuse option circuit. Further, even in the case that the value of the high resistance R is the same as that of the equivalent resistance at the junction, the output of the fuse option circuit becomes unstable and thus represents the Vcc or Vss potential alternately, which also results in the failure of the operation of the fuse option circuit. From the reasons mentioned above, problems which deteriorate the production yield exist.

SUMMARY OF THE INVENTION

Therefore, it is an object of the invention to solve the drawbacks as mentioned above and provide a fuse option circuit used for memory device capable of completely performing the function of the fuse option circuit even in the case that the fuse is incompletely connected.

According to one aspect of the present invention, there is provided a fuse option circuit for memory device including a fuse connected to a power supply, a first MOS transistor having a drain connected to one terminal of the fuse and a source connected to a ground potential, a CMOS inverter an input terminal of which is connected to the drain of the first MOS transistor, and a first inverter, connected to an output terminal of the CMOS inverter, for stabilizing a voltage level of the output terminal of the CMOS inverter. The gate of the first MOS transistor is connected to the output terminal of the CMOS inverter. The fuse option circuit for memory device further includes a second MOS transistor connected to the first MOS transistor in parallel and has predetermined resistive components. A turn-on resistance of the second MOS transistor is greater than the resistive components of the fuse when the fuse is stably connected, and is smaller when the fuse is unstably disconnected.

BRIEF DESCRIPTION OF THE DRAWINGS

For fuller understanding of the nature and objects of the invention, reference should be made to the following detailed description taken in conjunction with the accompanying drawing in which.

The operation of the preferred embodiment of the present invention as discussed above will now be described in detail.

DETAILED DESCRIPTION OF THE INVENTION

Figure 4:
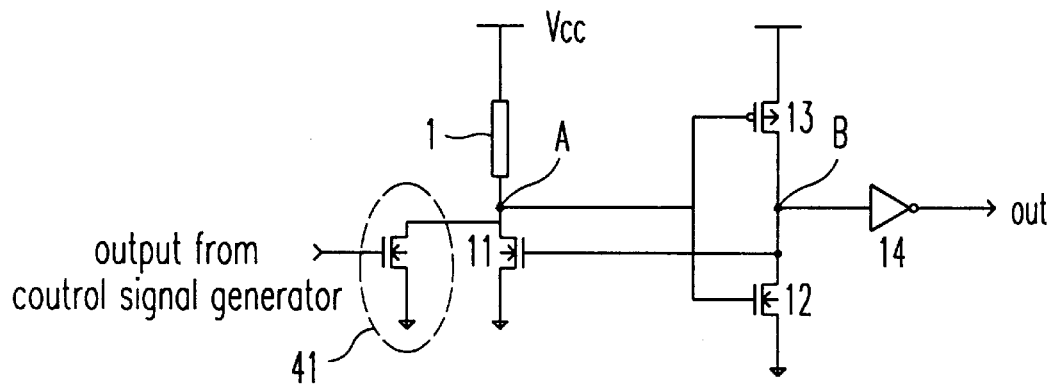
FIG. 4 illustrates a fuse option circuit in which a fuse is connected according to the present invention.

In order to achieve the objects of the invention, the present invention further includes a third NMOS transistor 41 which receives a new control signal, as shown in FIG. 4.

Referring now to FIG. 4, it schematically illustrates a fuse option circuit in which a fuse is connected according to the present invention. In the drawing, it is shown that at both the common gate terminal of the first PMOS transistor 13 and the second NMOS transistor 12, and terminal A connecting fuse 1 and the drain terminal of the first NMOS transistor 11, the third NMOS transistor 41 having a gate to which a predetermined control signal is applied by a control signal generator, a source connected to the ground and a drain connected to terminal A is newly added, in comparison with the conventional circuit as mentioned in the opening paragraph.

Under the condition that fuse 1 is connected, in order for the output of the fuse option circuit to be at the Vcc potential level, the voltage at terminal A should be kept at a high level. According to the present invention, if the value of the third NMOS transistor 41, to which a predetermined control signal is applied, is significantly greater than that of the resistance of the fuse, the voltage at terminal A is kept at a high level, so that the fuse option circuit operates stably.

Figure 5:
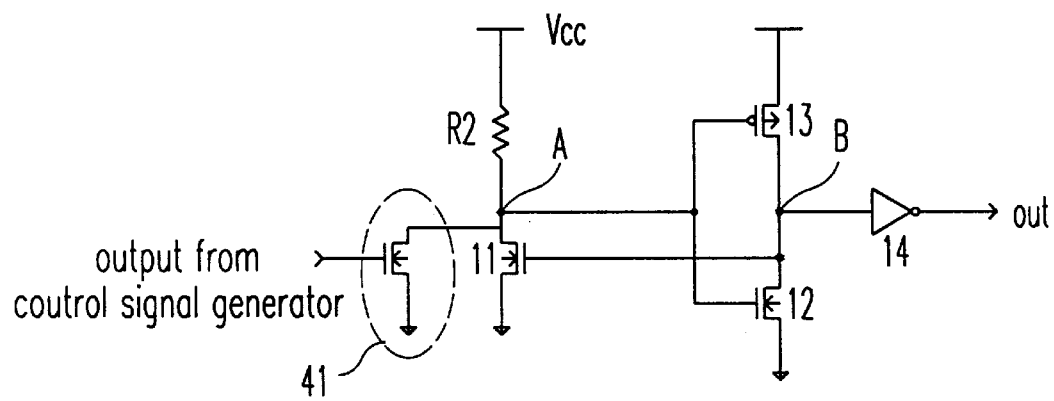
FIG. 5 shows a fuse option circuit showing a state where the fuse 1 is incompletely cut according to the present invention.

FIG. 5 represents a fuse option circuit showing a state where the fuse 1 is incompletely cut. Assuming that the resistance value between the power supply and terminal A is denoted as R2 at the state where the fuse is cut, the output of the fuse option circuit should be the Vss potential which is ground potential, in order to have the inventive fuse option circuit to be operated stably. In the fuse option circuit according to the present invention, if the resistance value R2 of the fuse is significantly greater than that of the third NMOS transistor 41, to which a predetermined control signal is applied, the voltage at terminal A is kept at a low level, so that the fuse option circuit operates stably. That is, if the resistance value of the third NMOS transistor 41 is smaller than that of the resistance value R2 of the fuse by adjusting the size of the third NMOS transistor 41, to which a predetermined gate voltage is applied, the potential at terminal A drops below Vcc/2 potential and the output level of the first inverter 14 reaches a low level, Vss, so that the fuse option circuit operates stably.

According to the fuse option circuit of the present invention, by additionally adding the third NMOS transistor 41 having a gate to which a predetermined control signal is applied, a drain which is connected to the fuse, and a source which is connected to the ground source, a malfunction of the fuse option circuit which occurred in the conventional fuse option circuit due to the incomplete disconnection of the fuse, can be prevented.

Now, the description of the control signal which is applied to the gate of the third NMOS transistor 41 will be made hereinafter.

Figure 6:
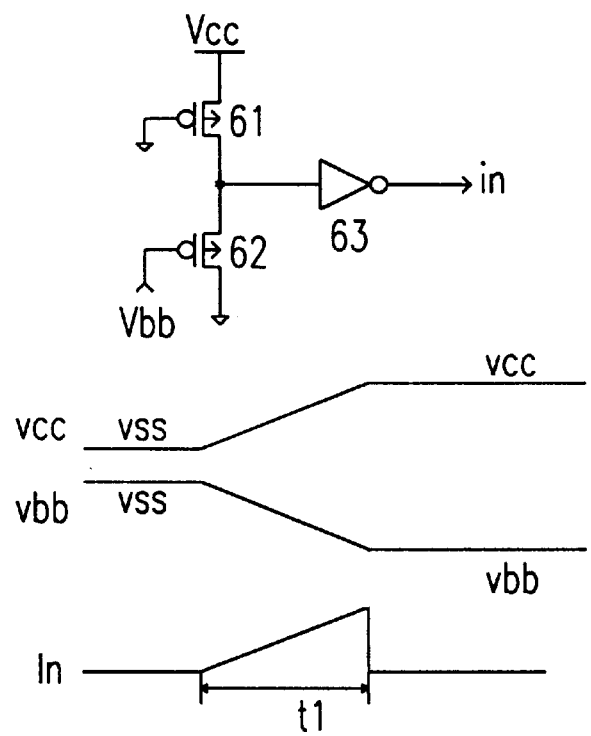
FIG. 6 is a control signal generator and its waveforms which explains a control signal that is applied to a gate of the NMOS transistor according to the first embodiment the present invention; and, FIG. 7 represents a control signal generator and its waveforms for explaining a control signal applied to a gate of the NMOS transistor according to the second embodiment the present invention.

FIG. 6 illustrates a control signal generator and its waveforms which explains a control signal which is applied to a gate of the NMOS transistor, in which it represents the waveforms of the control signal which is capable of determining the connection state of the fuse in the fuse option circuit upon the application of the power supply.

As shown in the drawing, the control signal generator includes a second PMOS transistor 61, a third PMOS transistor 62 and a second inverter 63. A source of the second PMOS transistor 61 is connected to the power supply, a gate thereof to the ground potential and a drain thereof to a source of the third PMOS transistor 62 and an input terminal of the second inverter 63, respectively. A power source Vbb which is dependent on the power supply is applied to the gate of the third PMOS transistor 62, and a control signal is outputted at the output terminal of the second inverter 63.

As shown in the signal waveforms in FIG. 6, when a power supply is turned on, it increases up to Vcc potential at a predetermined slope. At the same time, the potential of the power source Vbb which is dependent on the power supply, decreases from ground potential to a predetermined potential which is lower than that of the ground potential. That is, when power supply is applied to the source of the second PMOS transistor 61, the output potential of the power source Vbb which is dependent on the power supply is applied to the gate of the third PMOS transistor 62. Thus, a control signal in a saw waveform type is outputted through the inverter, as shown in the output waveforms.

According to the conventional fuse option circuit, the output of the fuse option circuit is unstable where the fuse is cut, whereas the fuse option circuit according to the present invention as shown in FIG. 4 clearly represents the connection state of the fuse by using the third NMOS transistor 41 which receives the control signal outputted from the control signal generator shown in FIG. 6.

That is, in the case wheret the fuse is connected, when the power supply is applied, the control signal in a saw waveform type is applied to the gate of the third NMOS transistor 41, such that the third NMOS transistor 41 reaches a conductive state. At the time, since the equivalent resistance of the third NMOS transistor 41 is greater than that of the fuse, the potential at terminal A is kept at a high level, and accordingly the output of the fuse option circuit through the inverter maintains the Vcc level. After a predetermined time has lapsed, since the control signal is kept to the ground potential, the output of the fuse option circuit continuously maintains the Vcc level.

In the case that the fuse is disconnected, when the power supply is applied, the control signal in a saw waveform type is applied to the gate of the third NMOS transistor 41, such that the third NMOS transistor 41 reaches a conductive state. At the time, since the equivalent resistance of the third NMOS transistor 41 is greater than that of the fuse being cut, the potential at terminal A is kept at a low level, and accordingly the output of the CMOS inverter reaches a high level. After a predetermined time has lapsed, although the control signal is kept at the ground potential, since the output of the CMOS inverter is kept at a high level, there are no changes in the operation of the fuse option circuit. Thus, the output of the fuse option circuit through the inverter maintains the Vss level, which is always in a low level state.

Figure 7:
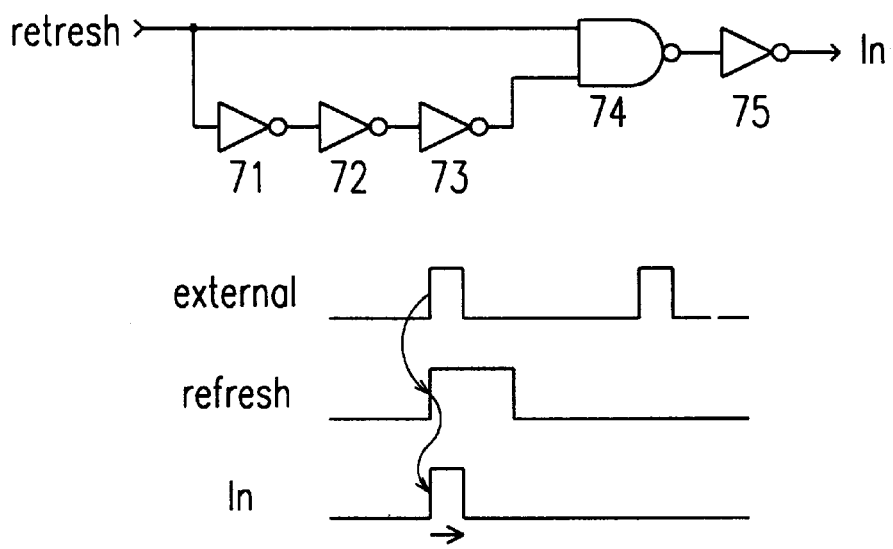

FIG. 7 represents a control signal generator and its waveforms which explains a control signal that is applied to the gate of the NMOS transistor, by which they are used to incorporate the condition for operating a memory chip upon the application of the power supply. For example, in the operation of the DRAM memory device, it is prescribed that, after 200 micro seconds is lapsed, 8 rasb cycles or 8 refresh cycles is performed and then a normal read and write operation is performed. Here, the control signal generator in FIG. 7 represents a circuit for use in the case that the 8 refresh cycles is applied among the examples. The construction of the control signal generator in FIG. 7 will now be described hereinafter.

Figure 1:
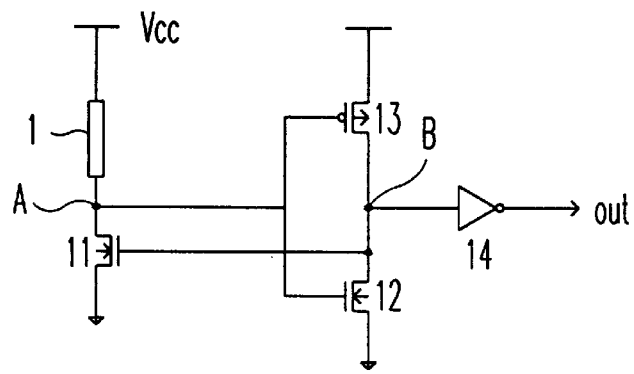
FIG. 1 illustrates a fuse option circuit in which a fuse is connected according to the prior art.
Figure 2:
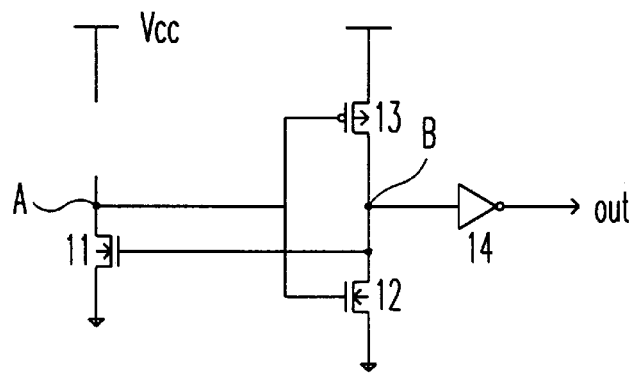
FIG. 2 shows a fuse option circuit in which a fuse is disconnected according to the prior art.
Figure 3:
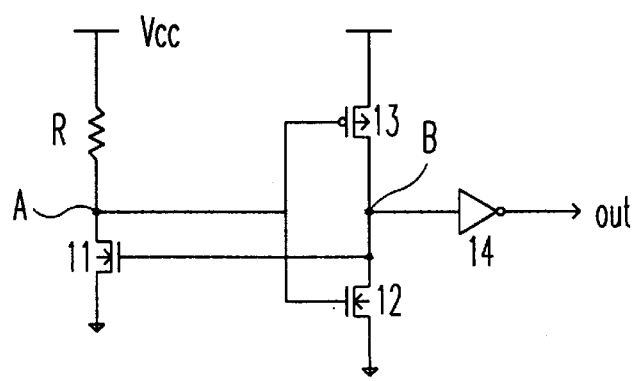
FIG. 3 represents a fuse option circuit showing a state where fuse 1 is incompletely cut according to the prior art.

The operation of the circuit according to the preferred embodiment of the present invention as discussed above is controlled by a control signal generated from the circuits shown in FIGS. 2 to 4 and thus will now be described in detail.

In the drawing, the control signal generator in FIG. 7 includes a third inverter 71, a fourth inverter 72 and a fifth inverter 73 which are serially connected to each other, a NAND element 74 having one input terminal to which the output of the fifth inverter 73 is applied, and a sixth inverter 75. At both the input terminal of the third inverter 71 and the other input terminal of the NAND element 74, a refresh signal responsive to an external refresh instruction is applied. As a result, the resulting control signal is outputted through the sixth inverter 75.

As fully appreciated from the circuit and its waveforms in FIG. 7, the pulse signal responding to the first instruction among the external refresh instruction signals defines the refresh signal. This refresh signal is then applied to the input terminal of the control signal generator in FIG. 7, so that the control signal required for the fuse option circuit according to the present invention is produced. The functions of the resulting pulsed control signal in FIG. 7 are identical to the functions of the circuit in FIG. 6.

As fully described above, according to the fuse option circuit of the present invention, by additionally adding the third NMOS transistor 41 which receives the output of the control signal generator at the input terminal of the fuse option circuit, the fuse connection state of the fuse option circuit is clearly established, such that advantageous effects which improve the production yield of the semiconductor device can be obtained.

Although the present invention and its advantages have been described in detail, it should be understood that various changes, substitutions and alterations can be made herein without departing from the spirit and scope of the invention as defined by the appended claims.

What is claimed is:

1. A fuse option circuit for a memory device, the circuit comprising:
    a) a fuse connected to a power supply, the fuse capable of being:
        1) stably connected; or
        2) unstably disconnected;
    b) a first MOS transistor having:
        1) a drain connected to the fuse;
        2) a source connected to a ground potential; and
        3) a gate;
    c) a CMOS inverter having:
        1) an input terminal connected to the drain of the first MOS transistor; and
        2) an output terminal, connected to the gate of the first MOS transistor, for clearly determining a connection state of the fuse;
    d) a first inverter, connected to the output terminal of the CMOS inverter, for stabilizing a voltage level of the output terminal of the CMOS inverter; and
    e) a second MOS transistor, connected in parallel to the first MOS transistor, and having a predetermined resistive value, wherein:
        1) a turn-on resistance value of the second MOS transistor is greater than the resistive value of the fuse when the fuse is stably connected; and
        2) the turn-on resistance value of the second MOS transistor is smaller than the resistive value of the fuse when the fuse is unstably disconnected.

2. The circuit of claim 1, further comprising:
    a control signal generator for outputting a control signal to control a turn-on or turn-off state of the second MOS transistor.

3. The circuit of claim 2, wherein:
    a) the control signal generator includes:
        1) a third MOS transistor;
        2) a fourth MOS transistor; and
        3) a second inverter having an input terminal and an output terminal;
    b) the third MOS transistor includes:
        1) a source connected to the power supply;
        2) a gate connected to the ground potential; and
        3) a drain connected both to a source of the fourth MOS transistor and to the input terminal of the second inverter; and
    c) a gate of the fourth MOS transistor inputs a voltage source dependent on the power supply, to cause the control signal to be output from the output terminal of the second inverter.

4. The circuit of claim 3, wherein:
    the control signal is a sawtooth-waveform pulse signal.

5. The circuit of claim 2, wherein the control signal generator includes:
    1) delay means for receiving a refresh signal, for delaying it for a predetermined period, and for outputting a delayed refresh signal;
    2) a NAND element for receiving the refresh signal and the delayed refresh signal from the delay means; and
    3) a third inverter for inverting an output signal from the NAND element so as to output the control signal.

6. The circuit of claim 5, wherein:
    the control signal is a rectangular pulse signal.

* * * * *